(12) United States Patent
Linnen et al.

(10) Patent No.: US 11,139,276 B2
(45) Date of Patent: Oct. 5, 2021

(54) SEMICONDUCTOR DEVICE INCLUDING FRACTURED SEMICONDUCTOR DIES

(71) Applicant: SANDISK TECHNOLOGIES LLC, Addison, TX (US)

(72) Inventors: Daniel Linnen, Naperville, IL (US); Kirubakaran Periyannan, Santa Clara, CA (US); Jayavel Pachamuthu, San Jose, CA (US); Narendhiran Cr, Bangalore (IN); Jay Dholakia, San Jose, CA (US); Everett Lyons, IV, San Jose, CA (US); Hoang Huynh, San Jose, CA (US); Dat Dinh, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 16/808,128

(22) Filed: Mar. 3, 2020

(65) Prior Publication Data
US 2021/0280559 A1    Sep. 9, 2021

(51) Int. Cl.
*H01L 23/00*    (2006.01)
*H01L 25/065*    (2006.01)
*H01L 23/525*    (2006.01)

(52) U.S. Cl.
CPC ...... *H01L 25/0657* (2013.01); *H01L 23/5256* (2013.01); *H01L 24/06* (2013.01); *H01L 2224/04042* (2013.01); *H01L 2225/06506* (2013.01); *H01L 2225/06562* (2013.01)

(58) Field of Classification Search
CPC . H01L 25/0657; H01L 23/5256; H01L 24/06; H01L 2224/04042; H01L 2225/06506; H01L 2225/06562
See application file for complete search history.

(56) References Cited

U.S. PATENT DOCUMENTS

| | | | |
|---|---|---|---|
| 2007/0004175 A1* | 1/2007 | Harris, Jr. | B28D 5/0011 438/460 |
| 2007/0278697 A1* | 12/2007 | Kuroda | H01L 23/3128 257/777 |
| 2011/0227217 A1* | 9/2011 | Suh | H01L 24/25 257/737 |

* cited by examiner

*Primary Examiner* — Timor Karimy
(74) *Attorney, Agent, or Firm* — Vierra Magen Marcus LLP

(57) ABSTRACT

A fractured semiconductor die is disclosed, together with a semiconductor device including the fractured semiconductor die. During fabrication of the semiconductor dies in a wafer, the wafer may be scored in a series of parallel scribe lines through portions of each row of semiconductor dies. The scribe lines then propagate through the full thickness of the wafer to fracture off a portion of each of the semiconductor dies. It may happen that electrical traces such as bit lines in the memory cell arrays short together during the die fracture process. These electrical shorts may be cleared by running a current through each of the electrical traces.

17 Claims, 11 Drawing Sheets

SEMICONDUCTOR DEVICE INCLUDING FRACTURED SEMICONDUCTOR DIES

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example cellular telephones, digital cameras, video game consoles, personal digital assistants, medical electronics, mobile and non-mobile computers, servers and solid state drives (SSDs).

Recently, ultra high density memory devices have been proposed using a 3D stacked memory structure having strings of memory cells formed into layers. One such storage device is sometimes referred to as a Bit Cost Scalable (BiCS) architecture. BiCS and other NAND memory devices are fabricated in a wafer which includes the memory device layer formed in a substrate base, such as silicon. The wafer is diced into individual semiconductor dies, which may then be stacked, electrically connected and encapsulated to form a completed semiconductor memory package.

Semiconductor dies are fabricated in standard sizes. However, at times it is desirable to use a smaller semiconductor die. For example, when packaging semiconductor dies in an offset stepped configuration, it may happen that some of the standard-sized dies in the stack would be offset to the point that they would extend outside of the standard footprint of the package.

DETAILED DESCRIPTION

Figure 1:
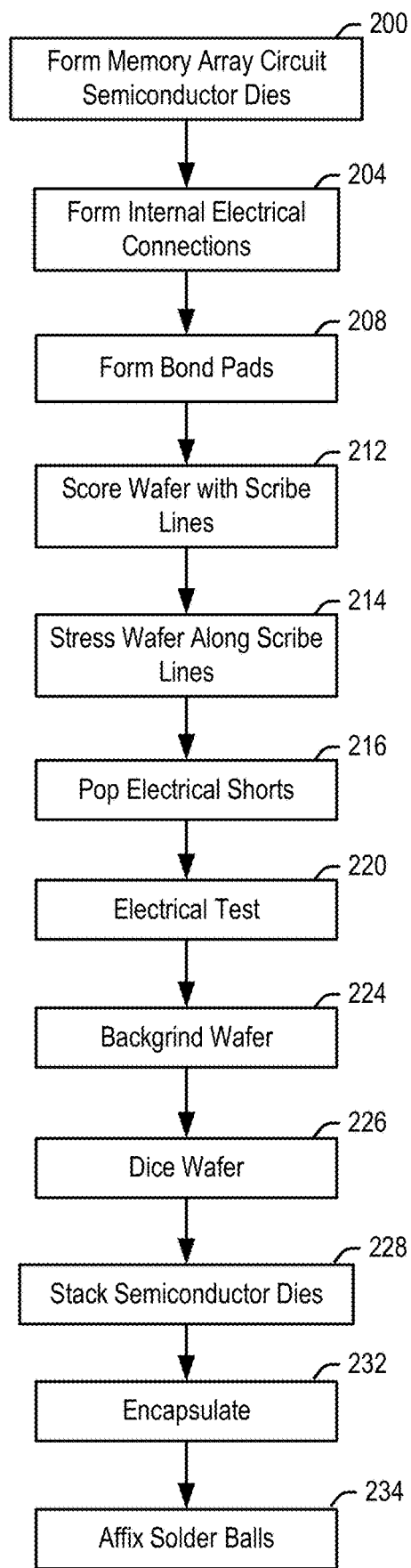
FIG. 1 is a flowchart for forming a semiconductor device according to embodiments of the present technology.

The present technology will now be described with reference to the figures, which in embodiments, relate to fractured semiconductor dies and semiconductor devices formed using fractured semiconductor dies. During fabrication of the semiconductor dies in a wafer, the wafer may be scored in a series of parallel scribe lines through portions of each row of semiconductor dies. The scribe lines then propagate through {1,0,0} crystallographic planes through the full thickness of the wafer to fracture off a portion of each of the semiconductor dies. The planes of the fractures are provided such that the memory cells remaining in the fractured semiconductor dies are unaffected by the fracture.

After fracture of the semiconductor dies, the wafer may be reassembled and tested for read/write operations. It may happen that electrical traces such as bit lines in the memory cell arrays short together during the die fracture process. In accordance with further aspects of the present technology, these electrical shorts may be cleared, or "popped," by running a current through each of the electrical traces.

After electrical test and popping of any electrical shorts, the semiconductor wafer may be thinned in a backgrind process, and the fractured semiconductor dies may be removed, discarding the fractured portions. Thereafter, the fractured semiconductor dies may be packaged by themselves or together with standard-sized semiconductor dies.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension. Depending on the parameter, the manufacturing tolerances may be greater than that in further embodiments, including for example ±5%, ±10% and ±25%.

Figure 2:
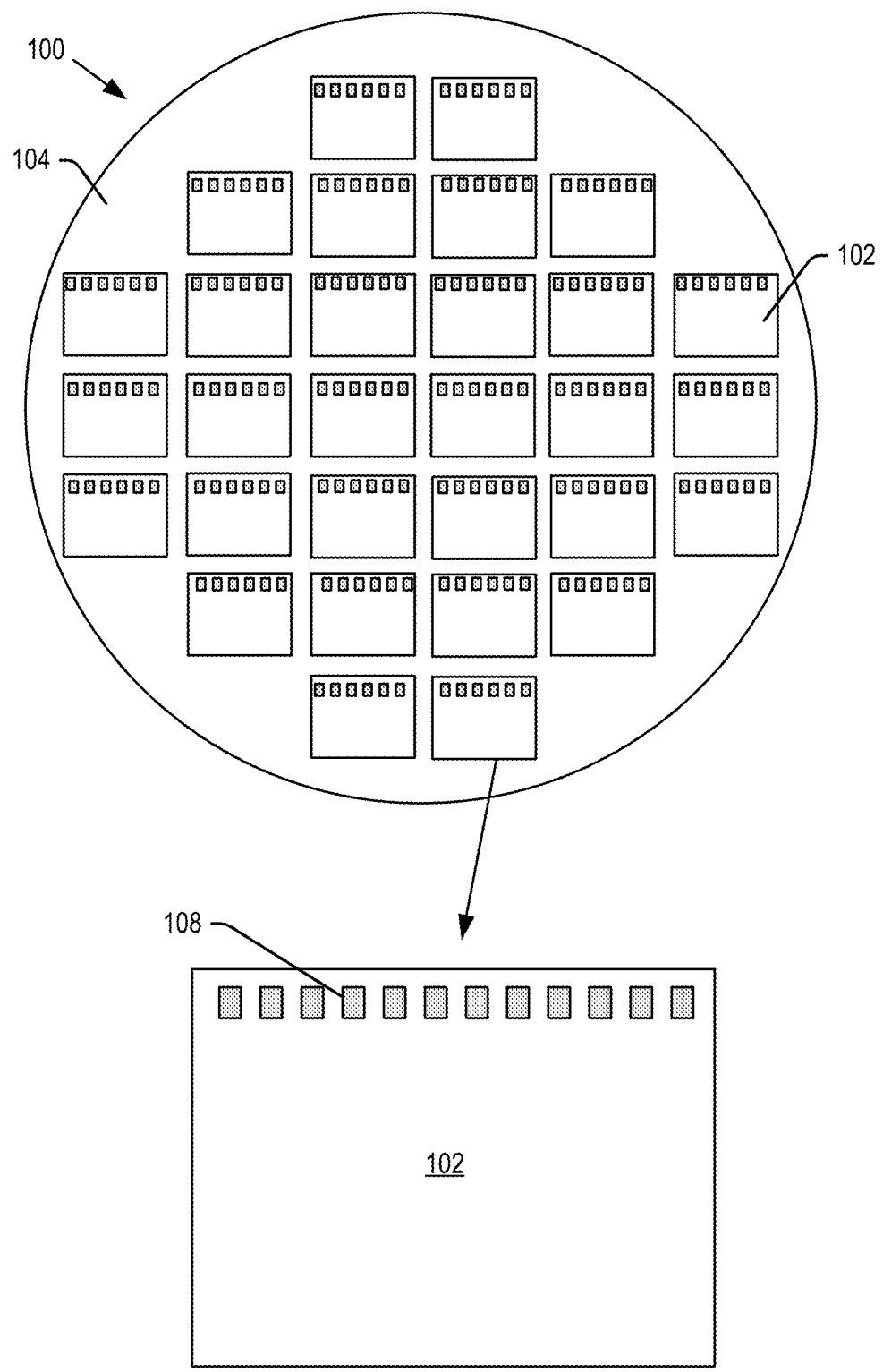
FIG. 2 is a top view of a semiconductor wafer, and a semiconductor die therefrom, according to embodiments of the present technology.

An embodiment of the present technology will now be explained with reference to the flowchart of FIG. 1, and the views of FIGS. 2-18. In step 200, a semiconductor wafer 100 may be processed into a number of semiconductor dies 102 as shown in FIG. 2. The semiconductor wafer 100 may start as an ingot of wafer material which may be monocrystalline silicon grown according to either a Czochralski (CZ) or floating zone (FZ) process. However, the wafer 100 may be formed of other materials and by other processes in further embodiments.

The semiconductor wafer 100 may be cut from the ingot and polished on both the first major planar surface 104, and second major planar surface 106 (FIG. 3) opposite surface 104, to provide smooth surfaces. The first major surface 104 may undergo various processing steps to divide the wafer 100 into the respective semiconductor dies 102, and to form integrated circuits of the respective semiconductor dies 102 on and/or in the first major surface 104.

Figure 3:
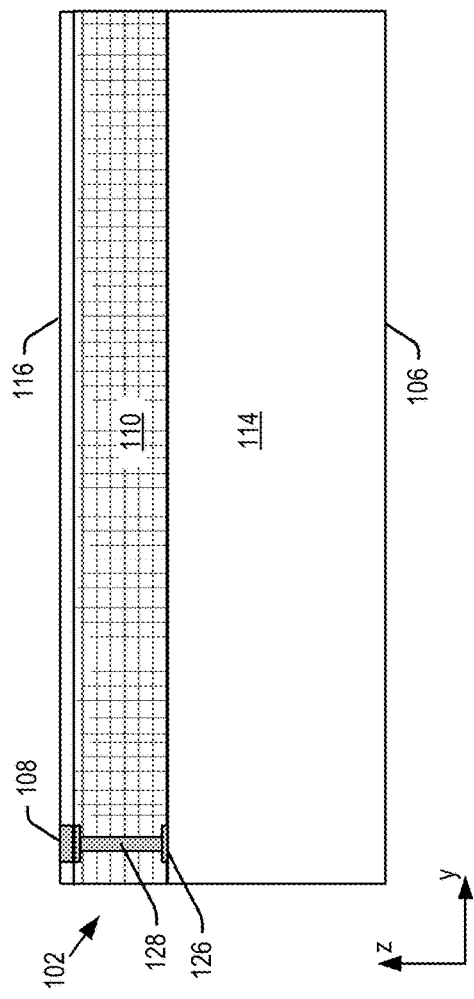
FIG. 3 is a cross-sectional edge view of a semiconductor die according to embodiments of the present technology.

In particular, in step 200, the semiconductor die 102 may be processed in embodiments to include integrated circuits in the form of memory cell array 110 fabricated in a dielectric substrate 114 as shown in the cross-sectional edge view of FIG. 3. FIG. 3 shows a single semiconductor die 102 from wafer 100. The substrate 114 may for example be or include silicon, such as silicon dioxide, but may be or include other materials in further embodiments. A passivation layer 116 may be formed on top of the surface of the dies 102. The passivation layer 116 may for example be silicon dioxide, but may be formed of other materials in further embodiments. Such additional materials may include silicon nitride, silicon carbon nitride or others.

The memory cell array 110 may be configured to include multiple memory elements in which each element is individually accessible. By way of non-limiting example, memory cell array 110 may be a flash memory system in a NAND configuration (NAND memory) that contains memory elements connected in series. The memory cell array 110 can be two-dimensional (2D), or three-dimensional (3D) including so-called BiCS memory cell arrays. Further details of one NAND configuration will now be described with reference to the perspective view of FIG. 4. It is understood that other memory configurations may be provided.

Figure 4:
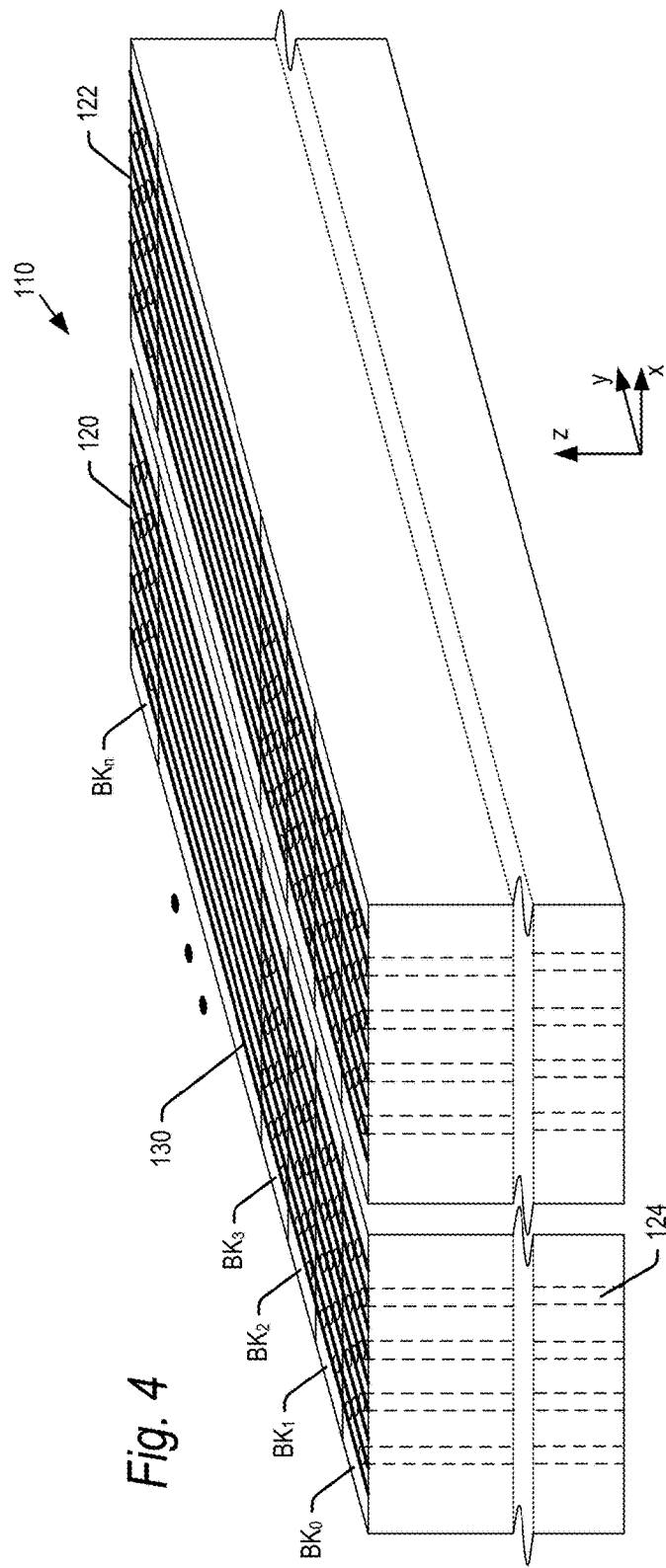
FIG. 4 is a perspective view of a portion of a memory cell array from the semiconductor die according to embodiments of the present technology.

FIG. 4 is a perspective view of a portion of one example embodiment of a monolithic three-dimensional memory cell array that can comprise memory cell array 110, which includes a plurality of non-volatile memory cells arranged as vertical NAND strings. The memory cell array 110 shown in FIG. 4 is arranged so that memory elements occupy multiple memory device levels, thereby forming a structure in three dimensions, i.e., in the x, y and z directions, where the z direction is substantially perpendicular, and the x and y directions are substantially parallel, to the major planar surface 104 of the semiconductor die 102.

The portion of memory cell array 110 shown in FIG. 4 is divided into two planes 120, 122. Each plane is then divided into n blocks ($BK_0$, $BK_1$, $BK_2$, $BK_3$, . . . , $BK_n$). In one example, each plane may have about 2000 blocks. However, different numbers of blocks and planes can be used in different embodiments. A block may represent a group of connected memory cells, sharing a common set of word lines. In embodiments, the first block, $BK_0$, may be nearest the end of die 102 including the die bond pads 108. Each plane 120, 122 may be identical to each other. The blocks in the first and second planes may be arranged along the y-axis, and each block may have boundaries residing in the x-z plane, perpendicular to the y-axis.

FIG. 4 further shows a plurality of circles that represent the vertical columns of NAND strings 124 (one such row of vertical columns shown in dashed lines in $BK_0$ for planes 120, 122). Each of the vertical columns include multiple select transistors and multiple memory cells. FIG. 4 shows only a portion of the memory cell array 110, and each plane 120, 122 may include many more vertical columns of NAND strings 124 than are shown. FIG. 4 further shows a set of electrical traces 130 in each plane 120, 122, which may for example be bit lines positioned above, and electrically connected to, the vertical NAND strings 124 in each of the blocks. There may be many more electrical traces 130 than are shown.

The memory cell array 110 may include additional components as is known. While a particular configuration of memory cell array 110 is shown in FIG. 4, the memory elements of memory cell array 110 may have other configurations in further embodiments. For example, the memory cell array 110 may be configured so that each element is individually accessible, e.g., a NOR memory cell array. NAND and NOR memory configurations are exemplary, and memory elements may be otherwise configured.

After or during formation of the memory cell array 110, internal electrical connections may be formed within the substrate 114 of semiconductor die 102 in step 204. The internal electrical connections may include multiple layers of metal interconnects 126 and vias 128 formed sequentially through layers of the substrate 114. As is known in the art, the metal interconnects 126, vias 128 and substrate 114 may be formed a layer at a time using photolithographic and thin-film deposition processes. The photolithographic processes may include for example pattern definition, plasma, chemical or dry etching and polishing. The thin-film deposition processes may include for example sputtering and/or chemical vapor deposition. The metal interconnects 126 may be formed of a variety of electrically conductive metals including for example copper and copper alloys as is known in the art, and the vias 128 may be lined and/or filled with a variety of electrically conductive metals including for example tungsten, copper and copper alloys as is known in the art.

In step 208, bond pads 108 may be formed on the major planar surface 104 of the semiconductor dies 102 as shown in FIGS. 2 and 3. The memory cell array 110 may be electrically connected to the bond pads 108 by the metal interconnects 126 and vias 128. The number and position of metal interconnects 126, vias 128 and bond pads 108 shown in FIGS. 2 and 3 is by way of example only, and may vary in further embodiments. For example, each die 102 may include more metal interconnects 126, vias 128 and bond pads 108 than are shown in further embodiments, and may include various other patterns of bond pads 108.

As noted in the Background section, semiconductor dies 102 are conventionally formed of standard sizes, and at times it may be desirable to form semiconductor dies 102 of smaller, customized dimensions. In accordance with aspects of the present technology, semiconductor dies 102 may be fractured in a plane perpendicular to the y-axis (FIGS. 3 and 4) to form such customized semiconductor dies 102. In particular, the semiconductor dies 102 may be fractured, to fracture off a portion of the integrated circuits, such as a portion memory cell array 110, from each semiconductor die 102. Fracturing of a semiconductor die 102 as explained below results in what is referred to herein as a fractured semiconductor die 102' and a fractured portion 132. The fractured semiconductor die 102' is an operational semiconductor die (albeit of less memory capacity than a semiconductor die 102). The fractured portion 132 may be discarded when the fractured semiconductor dies 102' are diced from the wafer 100 as explained below.

Figure 5:
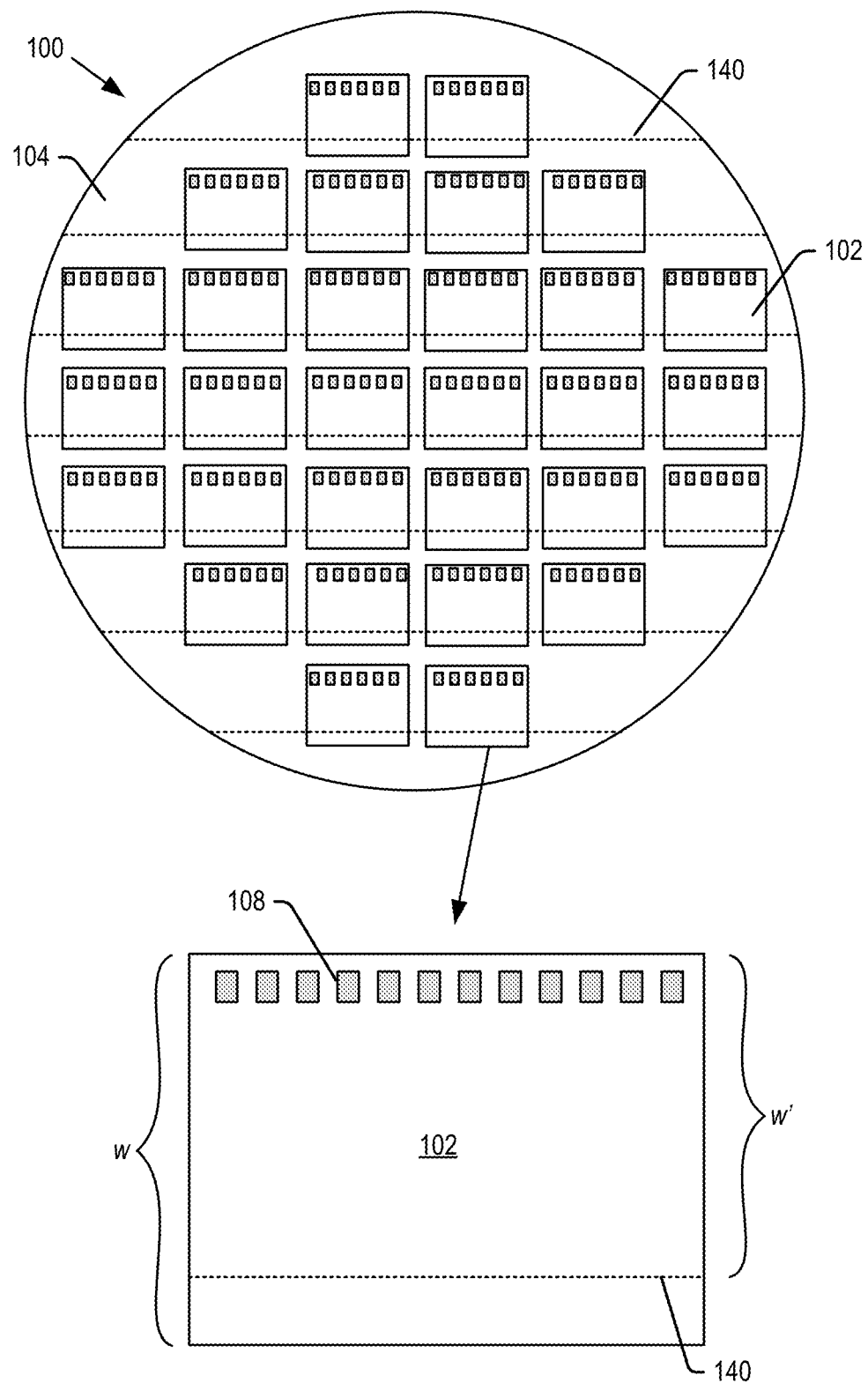
FIG. 5 is a top view of a semiconductor wafer, and a semiconductor die therefrom, with scoring lines to break off portions of the semiconductor dies according to embodiments of the present technology.

In step 212, semiconductor wafer 100 may be scored with scribe lines 140 as shown for example in FIG. 5. In embodiments, scribe lines 140 may be parallel to each other, passing through a portion of each semiconductor die 102 in a row of semiconductor dies on wafer 100. In embodiments, the scribe lines 140 may pass through the same position along the width dimension, w, of each row of semiconductor dies to provide the same width, w', of each fractured semiconductor die 102' in wafer 100. The dimension w' of a fractured semiconductor die 102' may vary in embodiments, but may for example be 50% to 95% of the width dimension w of an original, full die 102.

Figure 6:
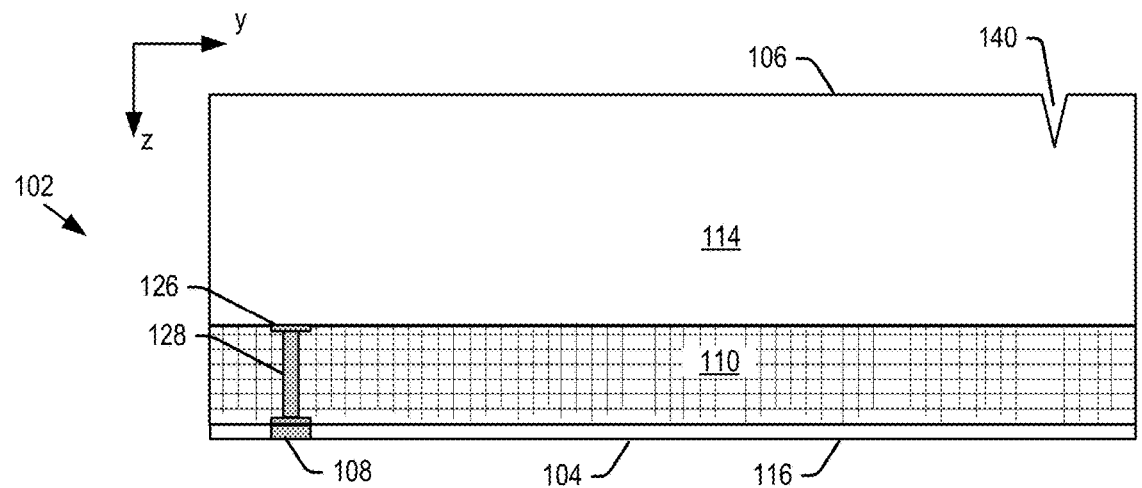
FIG. 6 is a cross-sectional edge view of a semiconductor die scored with a scribe line according to embodiments of the present technology.

As indicated in the cross-sectional view of FIG. 6, the scribe lines 140 may be formed in the second planar surface 106, while the active first major planar surface 104 is supported on a support table. One example of a support table for supporting the wafer 100 while scribe lines 140 are made is described hereinafter with respect to FIGS. 16-17. The scribe lines 140 may be formed using various technologies, including for example a diamond blade, laser, plasma cutting device or water jet, though other technologies are contemplated.

Figure 7:
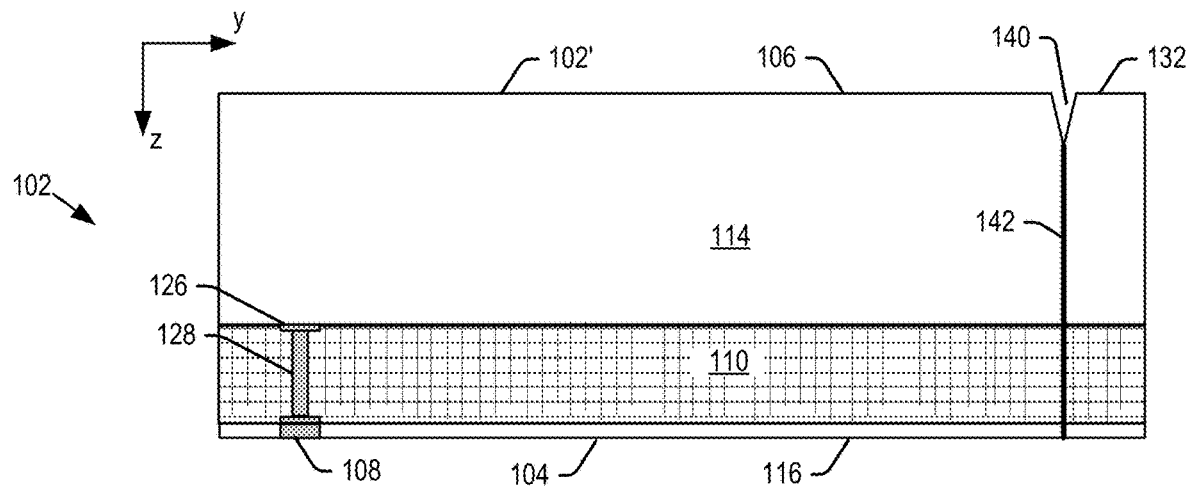
FIG. 7 is a cross-sectional edge view of a semiconductor die showing propagation of the scribe line through a thickness of the semiconductor die to fracture the die according to embodiments of the present technology.
Figure 8:
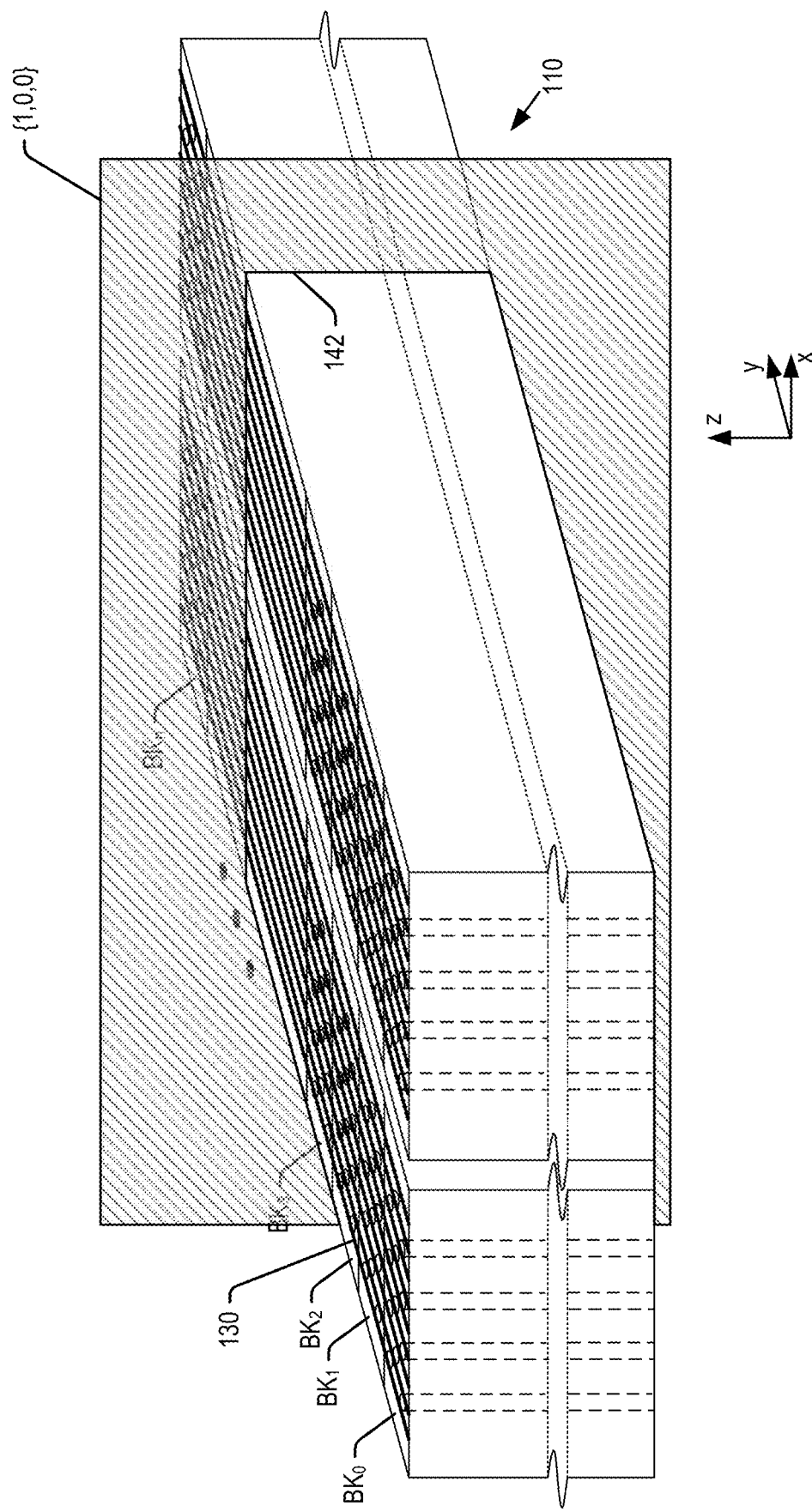
FIG. 8 is a perspective view illustrating a plane through which the memory cell array fractures.

In step 214, the wafer may be stressed along the scribe lines 140 to propagate the cut started by the scribe line 140 completely through the wafer 100, as indicated in the cross-section view of FIG. 7 and the perspective view of FIG. 8. One example of a fixture for stressing and fracturing the wafer along the scribe lines 140 is described hereinafter with respect to FIG. 18. Due to the crystalline composition of wafer 100, stressing of the wafer will propagate a planar cut 142 from the scribe lines 140, which will proceed through the wafer from the second major planar surface 106 to the first major planar surface 104 in a clean, planar direction. As indicated in FIG. 8, this cut will naturally propagate through a {1,0,0} crystallographic plane (i.e., the x-z plane) through the memory cell array 110 and the full thickness of the wafer to fracture off a portion 132 of each of the semiconductor dies 102.

As shown in FIGS. 7 and 8, fractured portion 132 may include a fractured portion of the memory cell array 110. The natural tendency of wafer 100 to fracture along the {1,0,0} crystallographic plane provides an advantage in that blocks ($BK_0$, $BK_1$, $BK_2$, $BK_3$, . . . , $BK_n$) are also oriented and divided along {1,0,0} crystallographic planes. Thus, the fracturing of dies 102 will be through one of the blocks, or at a boundary between a pair of blocks. The result is that voltages along electrical traces 130 will continue unaffected to/from the NAND strings within the blocks in front of the cut 142 (e.g., blocks $BK_0$, $BK_1$, $BK_2$, $BK_3$, etc., nearest the die bond pads 108). Thus, fracturing of a die 102 by planar cut 142 does not affect normal read/write operations with respect to the blocks which remain in fractured die 102'. The blocks behind the cut 142 (e.g., block $BK_n$, etc.) in the fractured portion 132 are effectively severed from the die 102 without affecting the operation of the blocks in fractured die 102'. In embodiments, one or more blocks adjacent the planar cut 142 may be designated as a guard band, so that no read/write operations are performed at these blocks.

The wafer 100 may be stressed along scribe lines 140 to propagate the planar cut 142 by a variety of methods. The wafer 100 may for example be stressed and fractured using a fixture 186 described below with respect to FIG. 18. Alternatively or additionally, the wafer 100 may be stressed by chilling the wafer to generate thermodynamic stresses in the wafer while reducing the malleability of the electrical traces 130 that get severed during the fracturing process. In further embodiments, the wafer may be placed on an adhesive tape which may be stretched to stress the wafer. In further embodiments, the formation of the scribe lines 140 alone may be sufficient stress to enable the planar cut 142 to propagate through the full thickness of the wafer from surface 106 to surface 104.

Figure 9:
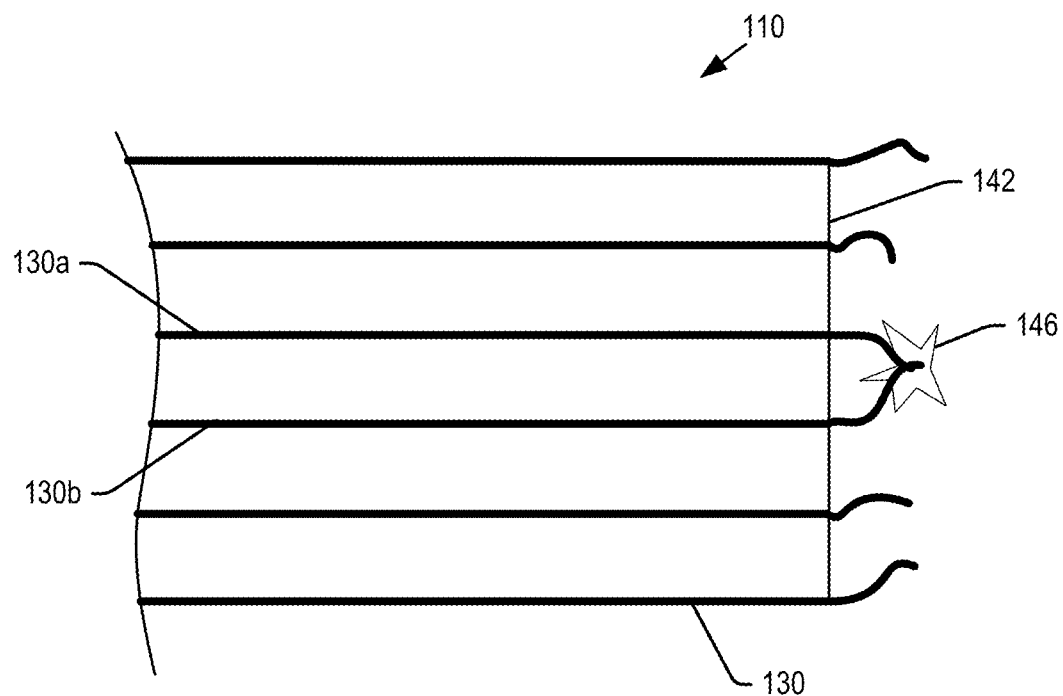
FIG. 9 is a top view of electrical traces of a portion of the memory cell array after fracture of the semiconductor die.

When a die 102 is fractured along planar cut 142, it may happen that one or more of the electrical traces 130 (or other electrical traces) are not cleanly severed. Such traces may for example get stretched before breaking during the fracturing step. In this instance, it may happen that one or more of these electrical traces electrically short together. For example, FIG. 9 shows a top view of a portion of the memory cell array 110 of a fractured semiconductor die 102' with electrical traces 130 that are not cleanly severed at the planar cut 142. Two such traces, 130a and 130b in this example are shown shorted together. These electrical shorts may be cleaned, or "popped," in accordance with further aspects of the present technology.

Figure 10:
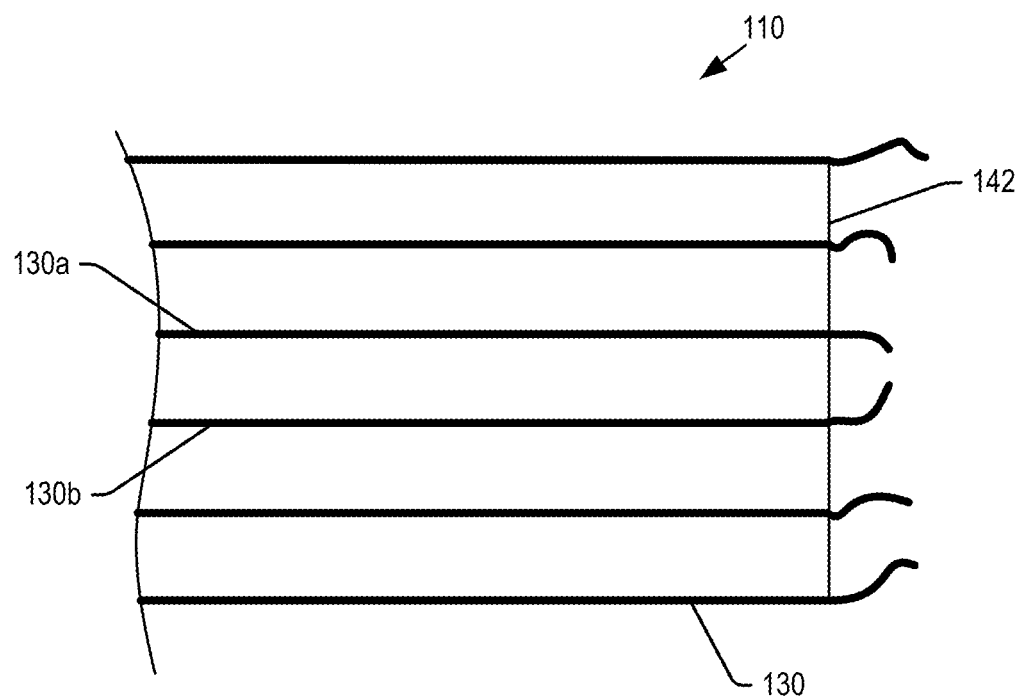
FIG. 10 is a top view of electrical traces of a portion of the memory cell array after clearing of any electrical shorts between respective traces of the memory cell array according to embodiments of the present technology.

Shorted electrical traces 130 may be popped by a variety of methods. In one embodiment, shorted electrical traces may be electrically popped. For example, a current may be applied to electrical traces 130, biasing adjacent traces 130 to different voltages. The cut ends of traces 130 would likely be thinner than intact portions of traces 130, and there would likely be a poor electrical connection between any shorted traces such as traces 130a and 130b. As such, current does not conduct well at the electrical shorts, and energy will be focused at the shorts in the form of heat when a current is provided across shorted electrical traces. The result is an area 146 at any electrical shorts of localized heating. These areas of localized heating will oxidize the electrical short upon the voltage differential. The electrical short would in effect form an electrical fuse which oxidizes and opens upon application of the current. FIG. 10 shows that the electrical short of FIG. 9 is popped after a current is run through traces 130a and 130b.

The current to electrical traces 130 to pop any electrical shorts may for example be applied in a series of write/erase operations. For example, where traces 130 are bit lines, current may be applied leaving alternate NAND strings programmed and unprogrammed while grounding the source. A high voltage may be applied to the bit lines of a block while turning on the word lines for the block to a lower voltage so as to ground alternate bit lines.

Electrical traces may be popped by methods other than electrical currents in further embodiments. In one such further embodiment, electrical shorts may be popped chemically. For example, any electrical shorts may be chemically etched.

After popping of electrical shorts, the operation of the fractured semiconductor dies 102' may be electrically tested in step 220, for example with read/write operations or electrical burn-in. The electrical test step 220 may be combined with the electrical short popping step 216 in further embodiments.

Figure 11:
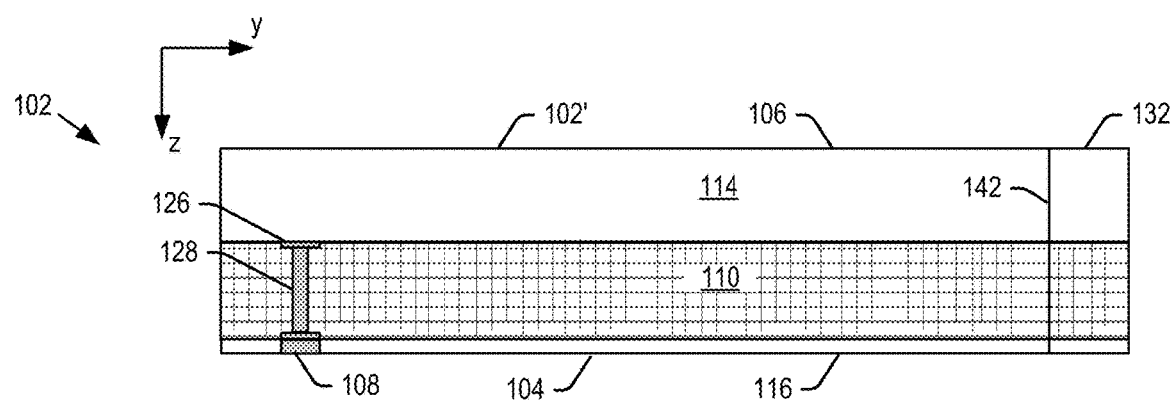
FIG. 11 is a cross-sectional edge view of a semiconductor die after backgrinding of the die to a final thickness.

In embodiments, the semiconductor dies 102 in wafer 100 are fractured as described above with the wafer 100 at full thickness (e.g., 760 μm). After fracturing of the respective dies 102, the individual pieces (fractured dies 102' and fractured portions 132) may be kept together or otherwise reassembled into wafer 100. Thereafter, with the first major planar surface 104 supported on a chuck or other support surface, the second major planar surface 106 may undergo a backgrind process in step 224 as shown in FIG. 11. In embodiments, the wafer 100 may be thinned in the backgrind process to 25 µm, though the final dimension may be thinner or thicker than that in further embodiments. In further embodiments, it is contemplated that the wafer 100 may be fractured as described above after the backgrind process in step 224.

Figure 12:
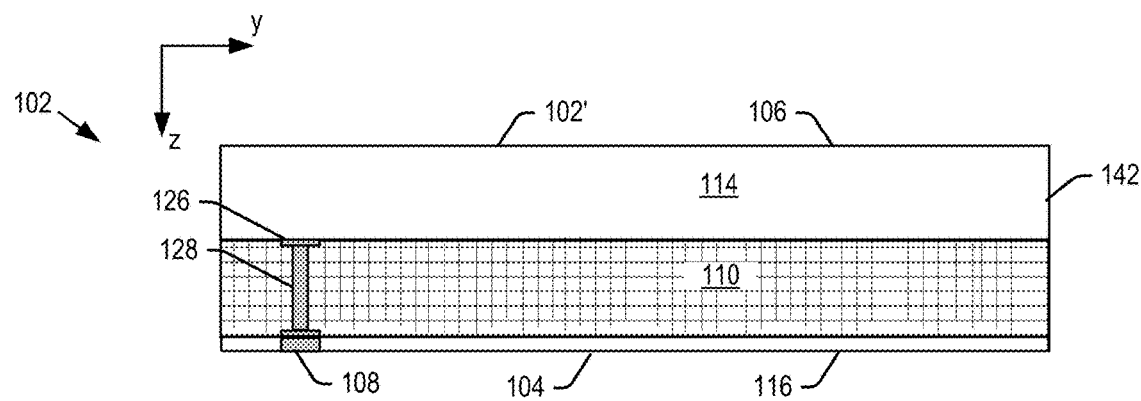
FIG. 12 is a cross-sectional edge view showing the final semiconductor die with the fractured portion removed according to embodiments of the present technology.

In step 226, the finished fractured dies 102' may be diced from the wafer 100, and the fractured portions 132 discarded, as shown in FIG. 12. In embodiments, the wafer 100 may be supported on a dicing tape, and then diced using for example the scoring and propagation methods described above. In further embodiments, the wafer 100 may be diced using a saw or laser penetrating through the full, final thickness of the wafer 100. In further embodiments, the dicing step 226 around the outline of each semiconductor die 102 may be performed at the same time and in the same process as the scoring and propagation steps 212, 214 described above to fracture each of the semiconductor dies 102. In such embodiments, the fractured semiconductor dies 102' would be fractured and diced in the same process.

Figure 13:
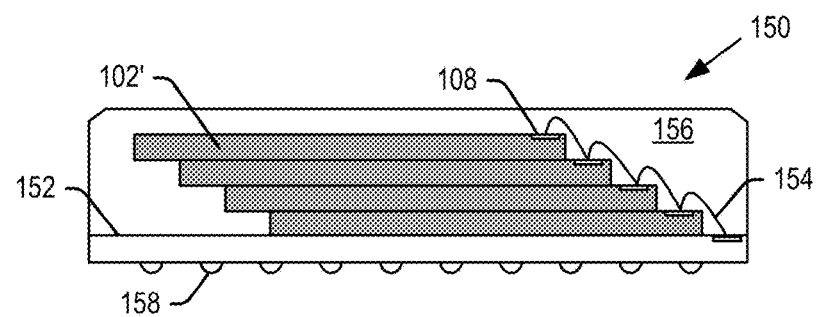
FIG. 13 is a cross-sectional edge view of a finished semiconductor device comprised of fractured semiconductor dies according to embodiments of the present technology.

After dicing, the fractured dies 102' may be stacked and packaged into a semiconductor device 150 in step 228 as shown in FIG. 13. The fractured dies 102' (shown with gray shading) may be mounted on a substrate 152 in a stepped, offset configuration leaving the bond pads 108 on each die uncovered. Thereafter, the fractured dies 102' may be wire bonded to each other and substrate 152 using bond wires 154 in a known wire bonding process. The fractured dies 102' may be electrically coupled to each other and substrate 152 by other methods in further embodiments, such as for example using through silicon vias (TSVs).

The fractured dies 102' and electrical connections may be encapsulated in a molding compound 156 in step 232 to form a completed semiconductor device 150. While semiconductor device 150 is shown as including four fractured dies 102', it is understood that device 150 may include other numbers of fractured dies 102' including for example 1, 2, 8, 16, 32, 64 or other numbers of dies. Solder balls 158 may optionally be provided on a bottom surface of substrate 152 in step 234 to allow connection of the semiconductor device 150 to a host device such as a printed circuit board.

Figure 14:
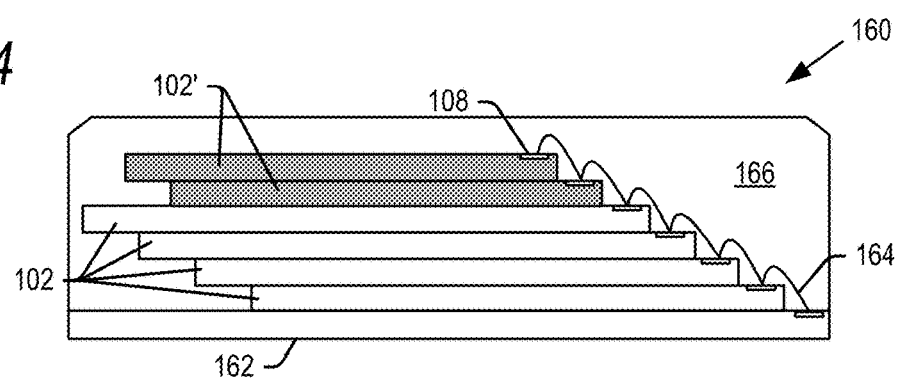
FIGS. 14-15 are cross-sectional edge views of finished semiconductor devices comprised of standard-sized and fractured semiconductor dies according to embodiments of the present technology.
Figure 15:
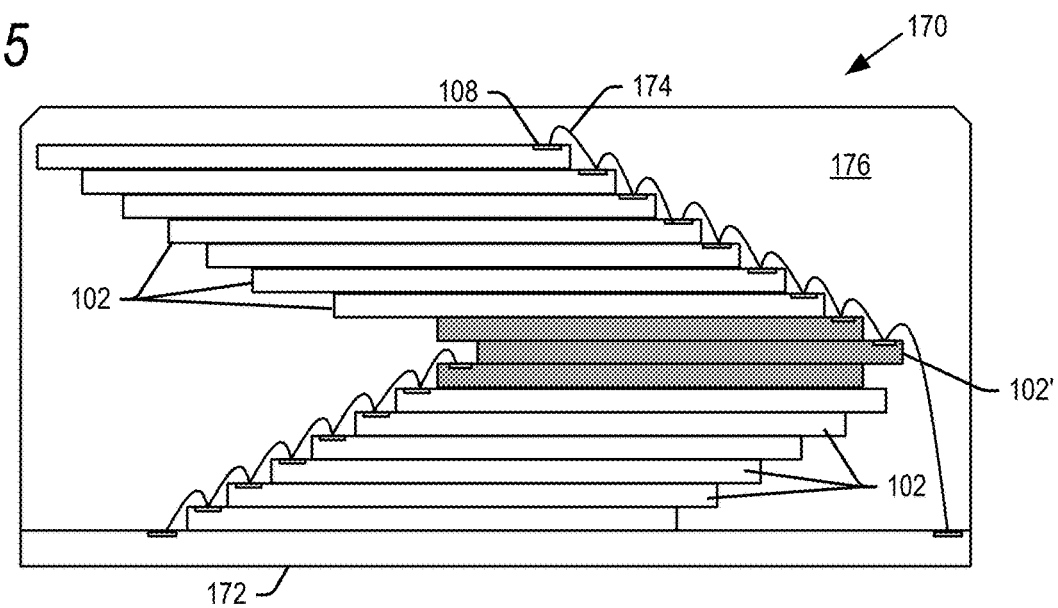

FIG. 13 shows a semiconductor device 150 comprised entirely of fractured dies 102'. In further embodiments, fractured dies 102' may be mixed together with standard-sized dies 102. Two examples are shown in FIGS. 14 and 15. FIG. 14 shows a semiconductor device 160 including a number of standard-sized semiconductor dies 102. Semiconductor packages such as device 160 are typically provided in standard-sized packages, such as for example the micro-SD form factor. In FIG. 14, provision of another offset semiconductor die 102 of standard size on top of the stack of standard-sized dies may extend outside of the footprint of the semiconductor device 160. As such, additional fractured dies 102' (shown with gray shading) may instead be added on top of the stack of standard-sized dies while staying within the required footprint of semiconductor device 160.

As in the semiconductor device 150 of FIG. 13, the semiconductor dies 102, 102' of semiconductor device 160 in FIG. 14 may be mounted on a substrate 162 in a stepped, offset configuration leaving the bond pads 108 on each die uncovered. Thereafter, the standard and fractured dies 102, 102' may be wire bonded to each other and substrate 162 using bond wires 164 in a known wire bonding process. As above, the dies 102, 102' may be coupled to each other and substrate 162 by other methods in further embodiments, such as for example using TSVs. A molding compound 166 may be provided around dies 102, 102' and the electrical connections to form a completed semiconductor device 160. The number of standard semiconductor dies 102 and fractured dies 102' in semiconductor device 160 are shown by way of example only, and there may be more or less standard dies 102, and/or more or less fractured dies 102' in further embodiments.

The semiconductor device 170 shown in FIG. 15 includes both standard semiconductor dies 102 and fractured semiconductor dies 102' (shown with gray shading) stacked in first and second oppositely stepped directions in a standard-sized package. The semiconductor device 170 may include a number of dies 102, 102' mounted on a substrate 172 and wire bonded together using bond wires 174. The device 170 may be encapsulated in molding compound 176. In the embodiment shown, use of the fractured dies 102' in the middle of the stack allows all of the dies (16 in this example) to be offset stacked on top of each other in a standard-sized package, such as for example the micro-SD form factor. The fractured dies 102' in this embodiment may be provided in the middle of the stack as shown, at the bottom of the stack and/or at the top of the stack to allow all of the dies to fit within the standard-sized package.

The number of standard semiconductor dies 102 and fractured dies 102' in semiconductor device 170 are shown by way of example only, and there may be more or less standard dies 102, and/or more or less fractured dies 102' in further embodiments. The dies 102, 102' may be electrically connected to each other and the substrate 172 by other methods, including for example using TSVs, or using an interposer at the boundary where the dies switch from stepping in a first direction to the second, opposite direction.

Figure 16:
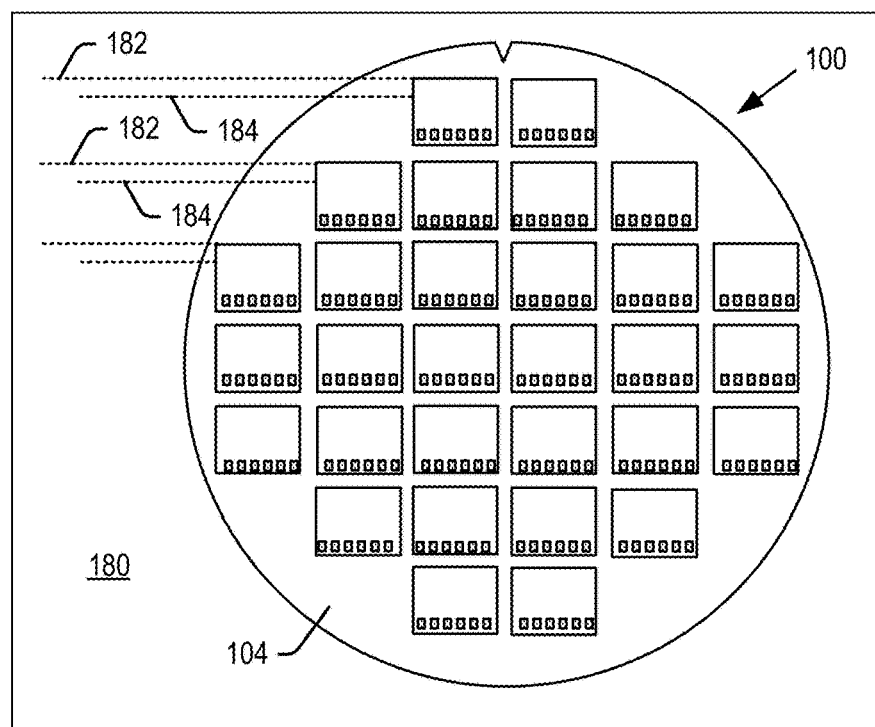
FIGS. 16-17 are top views of a support table for scoring a wafer according to embodiments of the present technology.
Figure 17:
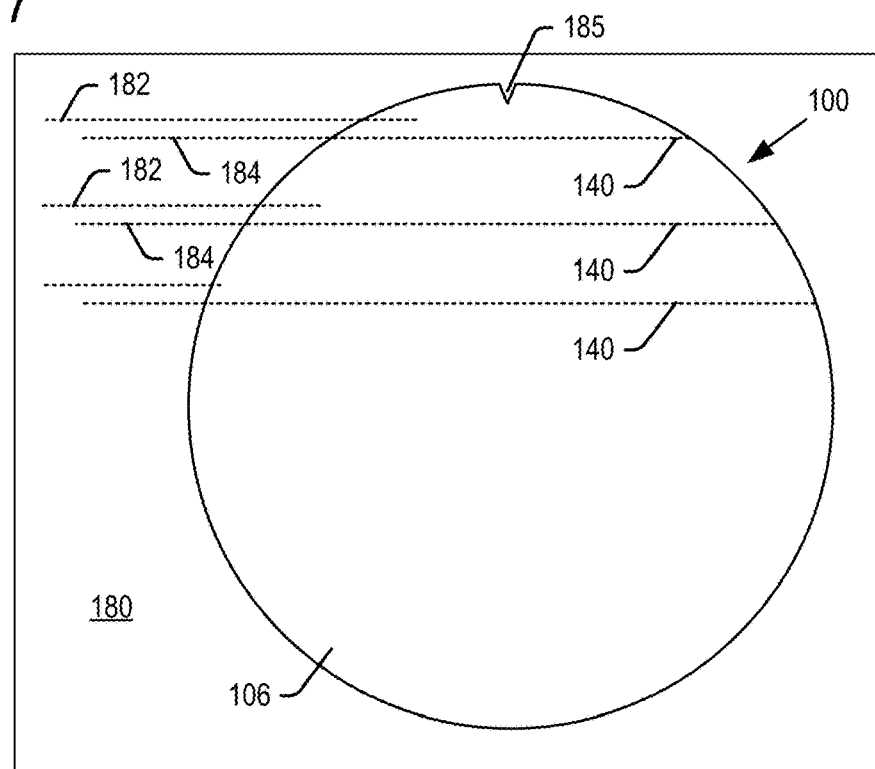

As noted above, semiconductor wafer 100 may be scored with scribe lines 140 in step 212. FIGS. 16 and 17 are top views of a table 180 which may be used in one example to form scribe lines 140. Wafer 100 may be mounted in a fixed position by restraints (not shown) on table 180 with the first major planar surface 104 facing upward as shown in FIG. 16. Top edge reference axes 182 (shown for a few rows of dies 102) may then be used to note the top edge of each row of semiconductor dies 102. Scribe line reference axes 184 (shown for a few rows of dies 102) may then be used to note the distance from the top edge at which scribe lines 140 are to be formed. Reference axes 182 and 184 may be indicated on table 180 with physical markers, optical beams, stored in a computer memory or by other methods.

With the reference axes noted, the wafer 100 may then be flipped over with the second major planar surface 106 facing upward. The wafer 100 may be fixed in the same orientation as in FIG. 16, using for example notch 185 in wafer 100 as a reference point. The second major planar surface 106 may then be scored with scribe lines 140 in line with scribe line reference axes 184 for each row of semiconductor dies 102. As noted above, scribe lines 140 may for example be formed using a blade, which may be automatically drawn across the surface of wafer 100 at scribe line reference axes 184. Scribe lines 140 may alternatively be formed manually by aligning a straight edge at each of the scribe line reference axes 184, and scoring the wafer 100 using a blade pulled across the straight edge. Scribe lines 140 may be formed in their proper positions on the second major planar surface 106 relative to an edge of the semiconductor dies in the first major planar surface 104 by other methods in further embodiments.

Figure 18:
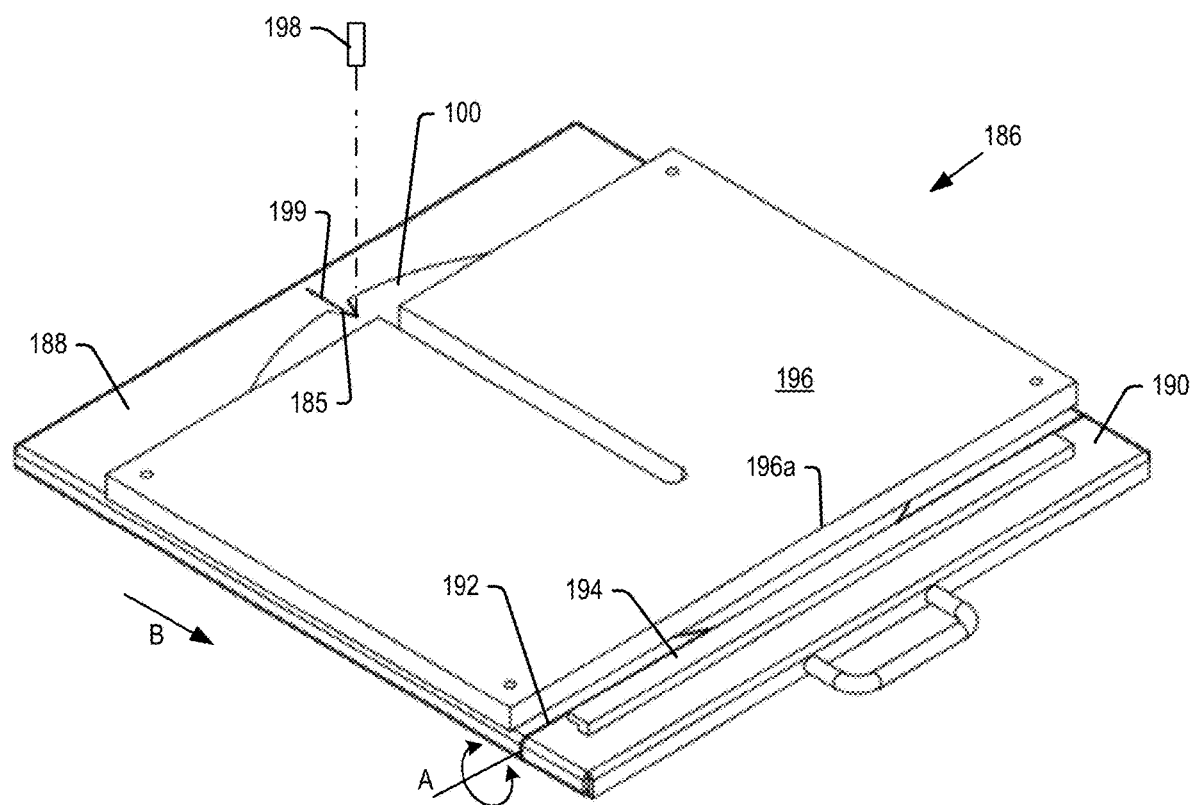
FIG. 18 is a perspective view of a fixture for fracturing a wafer according to embodiments of the present technology.

As noted above, the wafer 100 may be stressed and fractured at scribe lines 140 in step 214. FIG. 18 is a perspective view of a fixture 186 for stressing and fracturing the wafer 100 according to one embodiment of the present technology. Fixture 186 includes a base plate 188 having flat, planar surface and a hinge (not shown) at axis A. The hinge rotatably affixes an edge portion 190 to the base plate 188 so that the edge portion 190 can rotate relative to the base plate 188 about axis A, clockwise and/or counterclockwise. A seam 192 is formed where the edge portion 190 meets with the base plate 188.

The fixture 186 may further include a top plate 196 having a flat planar surface facing the flat planar surface of base plate 188. The top plate 196 may be fastened to the base plate 188 by pins on the base plate fitting within holes in the top plate so that the top plate 196 may be moved toward or away from the base plate 188. The top plate 196 may be movably fastened to base plate 188 by other methods in further embodiments.

In order to fracture the wafer 100 at scribe lines 140, the wafer may be inserted between base plate 188 and top plate 196 with the second major planar surface 106 of wafer 100 facing upward (toward top plate 196). The edge portion 190 may include a lip 194 for securing an edge of the wafer 100. The top plate 196 is provided with an edge 196a that is spaced from the seam 192 to create a space between the edge 196a and the lip 194.

The wafer 100 is positioned so that a scribe line 140 is parallel with, and aligned over, the seam 192. The wafer 100 may be secured in that position by a pin 198 fitting within one of a number of holes 199 in the wafer notch 185. Light pressure may also be applied on top plate 196 to prevent movement of the wafer 100 during the fracturing process. Next, the edge portion 190 may be rotated about axis A to stress and fracture the wafer at the aligned scribe line 140. As noted, in embodiments, the edge portion 190 may rotate clockwise, counterclockwise or both clockwise and counterclockwise.

Once a piece of the wafer 100 is fractured, the fractured piece may be removed from within the lip 194, the wafer may be moved in the direction of arrow B to align the next scribe line 140 with seam 192, and the process may be repeated. It is conceivable that more space is needed to align the very first scribe line 140 of wafer 100 with seam 192. Thus lip 194 may be secured in more than one position on edge portion 190 in further embodiments. As noted above, once the wafer 100 is fractured at each of the scribe lines 140, the wafer may be reassembled for example on a dicing tape into the original outline of the wafer for backgrind, dicing and further processing. It is understood that the wafer may be fractured using other fixtures and by other methods in further embodiments.

As noted above, the semiconductor wafer 100 may be chilled for the fracture step 214. In particular, given the malleability of the electrical traces in the memory cell array 110 at room temperature, fracturing the wafer 100 and memory dies 102 at room temperature may result in electrical traces which are not cleanly severed when the dies 102 in the wafer 100 are fractured. The present technology provides popping methods as described above for popping any electrical shorts which may result from fracturing the wafer 100 at room temperature. However, in a further embodiment, the wafer may be chilled prior to fracturing. In accordance with aspects of the present technology, chilling of the wafer before fracturing results in a cleaner break of the electrical traces along the fracture line.

In one embodiment, the wafer 100 may be chilled by submerging the wafer in a dry ice bath at −40° F. Other temperatures are contemplated. The wafer may be enclosed within a protective enclosure, such as for example a polyethylene bag, when submerged in the dry ice bath, though the protective enclosure may be omitted in further embodiments. The wafer 100 may be chilled by other means, such as for example immersing the wafer 100 in liquid nitrogen (with or without the protective enclosure).

Chilling the wafer 100 makes electrical traces 130 of the memory cell array 110 less malleable. As such, the traces 130 break more cleanly when the wafer 100 is fractured along planar cut 142. While chilling the wafer may provide for clean brakes of the electrical traces 130, it is conceivable that the method of popping electrical shorts described above may be used together with the method of chilling the wafer before fracturing. The wafer 100 may be chilled and then fractured within fixture 186 as described above. Alternatively, chilling the wafer 100 may generate thermodynamic stresses in wafer 100 facilitating propagation of the planar cuts 142 so that the wafer 100 may fracture at scribe lines 140 without the need of fixture 186.

In embodiments described above, the integrated circuits that are fractured from each semiconductor die 102 are part of memory cell array 110. However, in further embodiments, it is understood that the integrated circuits that get fractured from each semiconductor die may be other types of integrated circuits. Such additional types of integrated circuits may for example include control logic integrated circuits, random access memory integrated circuits and other types of integrated circuits.

The present technology provides advantages at least for example in that a fractured semiconductor die 102' is provided being some predefined and customizable fractional size of an undivided, original semiconductor die 102. By extension, a fractured semiconductor die 102' may have integrated circuits such as memory cells that are some predefined and customizable fraction of the memory cell array of an undivided, original semiconductor die 102. Provision of a fractured semiconductor die of customized, reduced size enables more semiconductor dies to be offset stacked in a package having a predefined form factor and/or footprint.

One example of the present technology relates to a semiconductor die including a substrate and die bond pads in the substrate. The die bond pads are configured to transfer electrical signals to and from the semiconductor die. The semiconductor die further includes integrated circuits in the substrate, where the integrated circuits electrically coupled to the die bond pads. In this example, the semiconductor die is fractured to a size that is smaller than an original size of the semiconductor die.

Another example of the present technology relates to a semiconductor device including first and second semiconductor dies. The first semiconductor die includes a first substrate, and a first group of die bond pads in the first substrate. The first group of die bond pads are configured to transfer electrical signals to and from the first semiconductor die. The first semiconductor die further includes first integrated circuits in the first substrate, where the first integrated circuits are electrically coupled to the first group of die bond pads. The second semiconductor die includes a second substrate, and a second group of die bond pads in the second substrate. The second group of die bond pads are configured to transfer electrical signals to and from the second semiconductor die. The second semiconductor die further includes second integrated circuits in the second substrate, where the second integrated circuits are electrically coupled to the second group of die bond pads. In this example, the second semiconductor die is fractured to a size smaller than an original size of the second semiconductor die and to a size smaller than the first semiconductor die.

A further example of the present technology relates to a semiconductor die including a substrate and die bond pads in the substrate. The die bond pads are configured to transfer electrical signals to and from the semiconductor die. The semiconductor die further includes a memory cell array in the substrate, where the memory cell array includes bit lines electrically coupled to the die bond pads. In this example, the semiconductor die is fractured to a size smaller than an original size of the semiconductor die. The semiconductor die of this example further includes means for clearing electrical shorts between bit lines which contact each other upon fracturing of the semiconductor die.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A semiconductor die, comprising:
a substrate;
die bond pads in the substrate, the die bond pads configured to transfer electrical signals to and from the semiconductor die; and
a memory cell array in the substrate, the memory cell array electrically coupled to the die bond pads, and the memory cell array divided into a plurality of blocks;
wherein the semiconductor die is fractured to a size smaller than an original size of the semiconductor die; and
wherein the semiconductor die is fractured at a block of the plurality of blocks at an edge of the semiconductor die.

2. The semiconductor die of claim 1, wherein the memory cell array is fractured upon fracturing the semiconductor die.

3. The semiconductor die of claim 2, wherein the memory cell array comprises a plurality of blocks sequentially arranged along an axis of the semiconductor die, the memory cell array fractured in a plane perpendicular to the axis along which the blocks are arranged.

4. The semiconductor die of claim 1, wherein the memory cell array comprises electrical traces electrically coupled to the die bond pads, wherein the electrical traces are fractured.

5. The semiconductor die of claim 4, wherein the fractured electrical traces comprise bit lines in a memory cell array.

6. The semiconductor die of claim 4, wherein a pair of electrical traces have been popped to clear an electrical short between the pair of electrical traces.

7. The semiconductor die of claim 1, wherein the size of the fractured semiconductor die is customized based on a size of a semiconductor package including the semiconductor die.

8. The semiconductor die of claim 1, wherein the size of the fractured semiconductor die is customized based on a size of a semiconductor package including the semiconductor die and a number of semiconductor die to be included in the package.

9. The semiconductor die of claim 1, wherein the semiconductor die is chilled before the semiconductor die is fractured.

10. A semiconductor device, comprising:
a first semiconductor die, comprising:
a first substrate,
a first group of die bond pads in the first substrate, the first group of die bond pads configured to transfer electrical signals to and from the first semiconductor die, and
first integrated circuits in the first substrate, the first integrated circuits electrically coupled to the first group of die bond pads;
wherein the first semiconductor die comprises fractured blocks at an edge of the first semiconductor die;
a second semiconductor die, comprising:
a second substrate,
a second group of die bond pads in the second substrate, the second group of die bond pads configured to transfer electrical signals to and from the second semiconductor die, and
second integrated circuits in the second substrate, the second integrated circuits electrically coupled to the second group of die bond pads;
wherein the second semiconductor die comprises a pair of popped traces at an edge of the second semiconductor die to clear an electrical short between the pair of popped traces.

11. The semiconductor device of claim 10, wherein the size of the second semiconductor die is customized based on a form factor of the semiconductor device.

12. The semiconductor device of claim 10, wherein the second semiconductor die is a memory die and the second integrated circuits comprise a memory cell array.

13. The semiconductor device of claim 12, wherein the memory cell array is fractured upon fracturing the second semiconductor die.

14. The semiconductor device of claim 10, wherein the second integrated circuits comprise electrical traces electrically coupled to the second group of die bond pads, wherein the electrical traces are fractured.

15. The semiconductor device of claim 14, wherein the fractured electrical traces comprise bit lines in a memory cell array.

16. The semiconductor device of claim 10, wherein the second semiconductor die is chilled before the second semiconductor die is fractured.

17. The semiconductor device of claim 10, wherein the first and second semiconductor dies are stacked on each other in an offset configuration to leave the first and second groups of bond pads exposed and available to receive a wire bond.

* * * * *